United States Patent [19]
Feuersanger

[11] 3,872,359

[45] Mar. 18, 1975

[54] THIN FILM TRANSISTOR AND METHOD OF FABRICATION THEREOF

[76] Inventor: Alfred E. Feuersanger, 66 Overlook Drive, Franklin Square, N.Y. 01701

[22] Filed: May 3, 1971

[21] Appl. No.: 139,841

Related U.S. Application Data

[60] Division of Ser. No. 14,739, Feb. 24, 1970, which is a continuation of Ser. No. 723,769, April 24, 1968, abandoned.

[52] U.S. Cl. ........................ 357/4, 357/23, 357/10, 357/61

[51] Int. Cl. ........................................ H01l 11/14

[58] Field of Search..... 317/234 S, 237, 238, 235 B, 317/235 R

[56] References Cited

UNITED STATES PATENTS

| | | | |
|---|---|---|---|
| 3,258,663 | 6/1966 | Weimer | 317/235 |
| 3,290,569 | 12/1966 | Weimer | 317/235 |

OTHER PUBLICATIONS

Semiconductors, N. Hannay, Rheinhold Publishing Corp., 1959, pages 617–625.

*Primary Examiner*—Martin H. Edlow
*Attorney, Agent, or Firm*—Irving M. Kriegsman; Robert A. Walsh

[57] ABSTRACT

A thin film transistor utilizing an insulated gate structure is described wherein the semiconducting layer is formed of defect-nickel oxide having the general formula $Ni_{(1-x)}O$, wherein $x$ is within the range of $10^{-7}$ to $10^{-2}$. In a preferred embodiment, the insulating layer overlying the defect-nickel oxide semiconducting layer is formed of stoichiometric nickel oxide thereby reducing the number of steps required in fabrication. The thin film transistor is fabricated within a single system by utilizing reactive sputtering for the formation of the semiconducting and insulating layers. The sputtering takes place in a pure oxygen atmosphere in the absence of inert gases with the result that the characteristics of the deposited nickel oxide films can be varied by controlling the deposition rate during sputtering.

3 Claims, 7 Drawing Figures

THIN FILM TRANSISTOR AND METHOD OF FABRICATION THEREOF

This is a division of U.S. Pat. No. 3,627,662, issued Dec. 14, 1971, which is a continuation of application Ser. No. 723,769, filed Apr. 24, 1968, now abandoned.

BACKGROUND OF THE INVENTION

The present invention relates to thin film transistors of the type wherein an insulating gate structure is utilized to modulate the flow of carriers between spaced source and drain electrodes. In particular, the invention relates to thin film transistors utilizing defect-nickel oxide semiconducting layers and a method of fabricating metal oxide semiconducting and insulating layers.

The theory and operation of the conventional thin film transistor are contained in an article titled "The TFT - A New Thin Film Transistor" by P. K. Weimer appearing in Vol. 50 of the Proceedings of the IEEE at page 1462 et seq. Generally, this type of device comprises source and drain electrodes having a separation therebetween. A semiconductor film is formed in the separation, and conduction between the electrodes takes place primarily within this semiconducting film. The current between electrodes is modulated by the application of a voltage to an insulating gate structure which overlies at least a portion of the semiconductor film. The gate structure includes an insulating film formed on the surface of the semiconducting film and a gate electrode formed on the insulating film.

The thin film transistor, as a result of the insulated gate configuration, exhibits a relatively high input impedance similar to that of a vacuum tube. In addition, the use of high carrier mobility semiconductor films enables the device to operate at relatively high frequencies. Since the semiconducting films used in thin film transistors are normally polycrystalline and contain a large number of defects, such as vacancies, impurities, dislocations, and grain boundaries, relatively few types of semiconductor materials exhibit sufficiently high carrier mobility to enable the device to operate over a wide band of frequencies. In practice, thin film transistors primarily utilize either silicon or cadmium sulfide thin semi-conducting films.

SUMMARY OF THE INVENTION

The present invention relates to thin film transistors utilizing defect-nickel oxide as the semiconducting film wherein the composition of this nickel oxide film has the general formula $Ni_{(1-x)}O$ and x is within the range of $10^{-7}$ to $10^{-2}$. Semi-conducting films formed of this material have been found to have a high carrier mobility, in excess of 20 $cm^2$/volt-sec, which enables a transistor utilizing this material to be operated at relatively high frequencies.

The thin film transistor constructed in accordance with this invention includes first and second spaced electrodes (hereinafter termed the source and drain electrodes respectively) formed on an insulating substrate. A defect-nickel oxide thin film is formed in the separation between the electrodes and comprises the semiconducting film through which conduction takes place. An insulating film is formed on the semiconductor film and overlies at least a portion of the separation between the source and drain. In addition, a gate electrode is formed on the surface of the insulating film. The application of a voltage to the gate electrode results in the establishment of an electric field in the underlying portions of the insulating and semi-conducting films which modulates the current flowing between the source and drain.

The thin semiconducting film in the present device is a defect-nickel oxide film having a relatively low resistivity, for example less than $10^8$ ohm/centimeters, and a thickness of typically 1000 Angstroms. Nickel oxide is an oxide of the 3d transition metal class and has a relatively high intrinsic resistivity, e.g., of about $10^{13}$ ohm-/centimeters, when stoichiometric. However, the nickel oxide may be doped with materials such as lithium in order to provide the relatively low resistivity characteristic required of semiconducting materials. The use of dopants for the nickel oxide results in the generation of $Ni^{3+}$ or 3d holes which are characterized by having low mobilities ($10^{-3}$ to $10^{-1}$$cm^2$/volt-sec.). While the doping of nickel oxide provides relatively low resistivity material, the low mobility of 3d holes limits the bandwidth of a thin film transistor utilizing doped nickel oxide semiconducting films. In the case of the present defect-nickel oxide film, the resistivity of the material is lowered by the contribution of holes in the oxygen 2P band resulting from the defect structure of the material. The defect structure is due to an excess of oxygen atoms for the number of nickel atoms present. The 2P holes have a relatively high mobility in the range from 10 to 1000 $cm^2$/volt-sec and provide a thin film transistor having a low resistivity metal oxide semiconducting film which is capable of operation over a wide band of frequencies.

The insulating layer formed on the semiconducting film is a metal oxide film having a relatively high resistivity at least $10^{10}$ ohm/centimeters. While films such a $TiO_2$, $Ta_2O_5$, $BaTiO_3$ and the like may be utilized in particular embodiments, the use of NiO as the insulating film has been found to provide the required relatively high resistivity and at the same time reduce the number of steps required to fabricate the transistor. Since the semiconducting and insulating films both contain nickel and oxygen, the films can be prepared in one continuous operation by changing the conditions during film deposition. In addition, using these materials for the sequentially formed films insures that the interface is relatively clean and a structural match between films is provided thereby minimizing the possibility of surface states existing at the interface.

One method of fabricating the semiconducting and insulating nickel oxide films utilizes reactive sputtering in a pure oxygen atmosphere. Previously, reactive sputtering techniques utilized in the fabrication of metal oxide films employed an inert gas within the reaction chamber. The atoms of the inert gas, typically argon, are relatively heavy when compared with the oxygen atoms and, when accelerated, possess greater energy than the oxygen so that the sputtering rate is substantially increased. However, the use of a pure oxygen atmosphere in the case of the reactive sputtering of nickel oxide films has been found to enable the properties of the films to be varied for a particular oxygen pressure by the deposition of the material. In particular, at low deposition rates, oxygen in the sputtering chamber is apparently trapped in the film as it is formed to produce the defect-nickel semiconducting film. As a result, a thin film transistor can be readily fabricated within a single reaction chamber by utilizing the present method for formation of the semiconducting and insulating films. Further features and advantages of the invention will become more readily apparent from the following description of a specific embodiment and a method of making this embodiment when taken in conjunction with the accompanying drawings.

DISCUSSION OF THE PREFERRED EMBODIMENT

Figure 1:
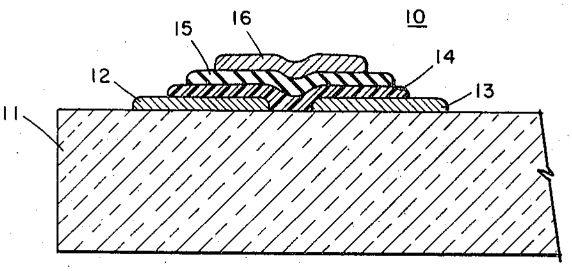
FIG. 1 is a side view in section of one embodiment of the invention.

Referring now to FIG. 1, a thin film transistor 10 is shown formed on insulating substrate 11. The transistor includes source and drain electrodes 12, 13 formed on the surface of substrate 11. The source and drain electrodes are shown having a separation therebetween. A semiconductor film 14 of defect-nickel oxide material is formed in overlying relationship with a portion of the source and drain electrodes and extends into the separation therebetween. The insulating film 15 is formed on the surface of semiconducting film 14 and a gate electrode 16 is located on the surface of film 15. As shown, the gate electrode overlies the separation between the source and drain electrodes so that the application of a control voltage thereto establishes an electric field within the insulating and semiconducting films which modulates the current flowing between the source and drain electrodes. This type of structure is generally referred to as an insulated-gate configuration and is characterized by a relatively high input impedance. The input impedance is primarily determined by the thickness of insulating film 15 and the dielectric constant of the material employed.

The substrate 11 is comprised of an insulating material and the surface thereof is highly polished. The source and drain electrodes 12, 13 are formed of metal, such as gold or aluminum, and are normally evaporated upon the substrate surface. The semiconducting film 14 is a thin defect-nickel oxide film having a thickness within the range of 500 to 3000 Angstroms. In addition, the resistivity of this defect-nickel oxide film is required to be relatively low, for example less than $10^8$ ohm/centimeters. The insulating film 15 has a thickness of from about 1000 to 2000 Angstroms and a relatively high resistivity within the approximate range of $10^{10}$ to $10^{13}$ ohm/centimeters. The control electrode 16 is an evaporated metal film such as gold or aluminum.

The semiconducting film 14 is formed of $Ni_{(1-x)}O$, wherein $x$ is within the range of $10^{-7}$ to $10^{-2}$. This material is referred to herein as defect-nickel oxide due to the fact that the vacancies are caused by reducing the number of nickel atoms in the material below that required to form the stoichiometric NiO compound. The resistivity of stoichiometric nickel oxide is relatively high with the intrinsic resistivity being of the order of $10^{13}$ ohm/centimeters at 300°K. To enable a nickel oxide material to be utilized as the semiconducting layer in a thin film transistor, the resistivity of the material is required to be substantially less than the resistivity of the stoichiometric nickel oxide. This condition is obtained by insuring that $x$ in the above formula is at least $10^{-7}$. In addition to a decrease in resistivity, the mobility of the carriers in the semiconducting layer must be relatively high, for example on the order of 10 to 1000 $cm^2$/volt-sec in order to enable the device utilizing this material to operate at relatively high frequencies.

Generally, there are three mechanisms that can be used to lower the resistivity of nickel oxide. These mechanisms exist simultaneously and are shown to be related in the following conductivity formula $$\sigma = \sigma_p^{o} + \sigma_p^{Ni} + \sigma_n^{Ni}$$

where $\sigma$ is the conductivity of the material, $\sigma_p^{o}$ is the contribution by holes in the oxygen 2p levels, $\sigma_p^{Ni}$ is the contribution to conductivity generated by holes in the nickel 3d levels and $\sigma_n^{Ni}$ is the contribution due to electrons in the nickel 3d levels. Previously, nickel oxide having a resistivity of the order of 0.1 ohm-centimeter was provided by doping the nickel with $Li_2O$. The lithium doping decreases the $\sigma_p^{Ni}$ term in the aforementioned equation due to the generation of holes by lithium ion substitution in cation sites in the material. However, low resistivity nickel oxide provided by lithium doping has proved unsuitable for use in thin film transistors due to the low mobilities exhibited by the carriers in these materials. This undesired result occurs not only for lithium doping, but also with other dopants since this technique results in the generation of $Ni^{3+}$ or 3d holes having characteristic mobilities of $10^{-3}$ to $10^{-1}$ $cm^2$/volt/sec.

The defect nickel-oxide material has a relatively high conductivity due to the increase in the $\sigma_p^{o}$ term due to the contribution of holes in the oxygen 2p level resulting from the deficiency of nickel atoms in the material. These 2p level holes have a mobility in the range of 10 to 1000 $cm^2$/volt/sec and permit the use of low resistivity nickel oxide films as the semiconducting film in thin film transistors.

Figure 2:
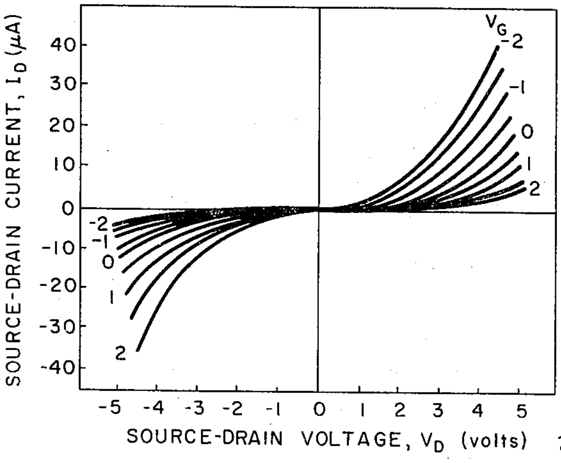
FIGS. 2, 3 and 4 are curves showing the source-drain characteristics of different embodiments of the invention.

The electrical characteristics of the embodiment of FIG. 1 having a defect-nickel oxide semiconducting film 14 with a resistivity of $7.5 \times 10^7$ohm/cm, a carrier mobility of about 22 $cm^2$/volt/sec and a nickel oxide insulating film having a dielectric constant of 15 and a resistivity of $4.7 \times 10^{11}$ ohm/cm is shown in FIG. 2. The length of the separation between source and drain electrodes is 40 mils. In operation, the transistor exhibits a square-law dependence of source-drain current upon source-drain voltage up to about 2 volts thereby indicating a space charge limited current flow. At higher source-drain voltages, the curves approximate third power law operation due presumably to double injection at the source and drain. Also, the curves show that the device exhibits symmetry with respect to the source-drain voltage. Since the source-drain voltage $V_D$ and the gate voltage $V_G$ act in opposition to increase the current $I_D$, the operation of the device is characteristic of the p-type enhancement mode. The calculated amplification characteristic of the thin film transistor is 40 for a 1 mil separation between the source and drain.

The observed transconductance is 650 μmhos and the calculated gain bandwidth product is approximately 6 MHz. It shall be recognized that these operating characteristics are determined by the geometry of the device and can be varied accordingly. One variation in geometry that has been found to effectively double the transconductance utilizes two gate electrodes which are located on opposite sides of the semiconducting film.

Figure 3:
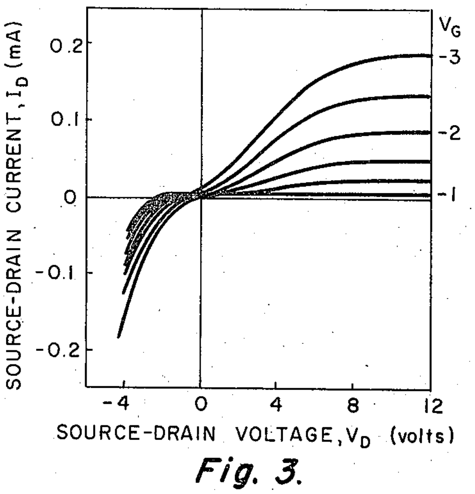
Figure 4:
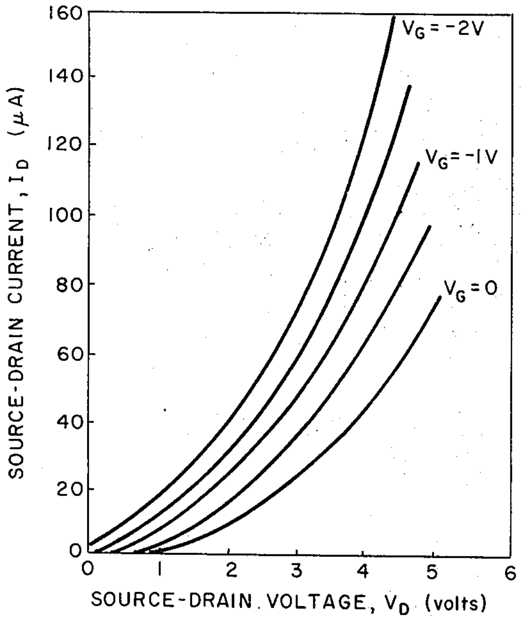

Further, the curves of FIG. 3 relate to an embodiment utilizing a semiconducting film having a resistivity of about $10^3$ ohm/cm. The curves show the saturated field-effect pentode characteristics for positive drain voltages. In addition, the curves of FIG. 4 relate to an embodiment utilizing a $TiO_2$ insulating film and are substantially similar to the characteristics of FIG. 2 for the nickel oxide semiconducting and insulating film embodiment.

While the insulating film 15 may be formed of $TiO_2$, $BaTiO_3$, $PbTiO_3$, $Ta_2O_5$, $SiO_2$ or $Al_2O_3$, the preferred embodiments of the invention utilize nickel oxide having a resistivity within the approximate range of $10^{11}$ to $10^{13}$ ohm/cm. This insulating material has a dielectric constant of about 15. The thickness of this preferred insulating film is within the approximate range of 1000 to 2000 Angstroms. By utilizing the nickel oxide insulating film, both the semiconducting and insulating layers have the same constituents and a structural match therebetween is obtained. As a result, the films can be prepared in a continuous process to insure that the interface is clean and no undesired surface layer is formed.

The nickel oxide and defect-nickel oxide thin film transistor may be fabricated by the reactive sputtering of the films in a conventional sputtering system. The sputtering of atoms or molecules onto a substrate can proceed from a high purity metallic nickel or oxidized nickel cathode in a sputtering gas containing oxygen as the reactive component. In addition, nickel oxide can be prepared by the thermal oxidation of the metal at temperatures exceeding 400°C and by the decomposition of nickel halides at temperatures of the order of 600° – 700°C. However, it is desirable to form both nickel oxide films in a single process taking place in a single chamber without exposing the device to the atmosphere during fabrication.

Figure 5:
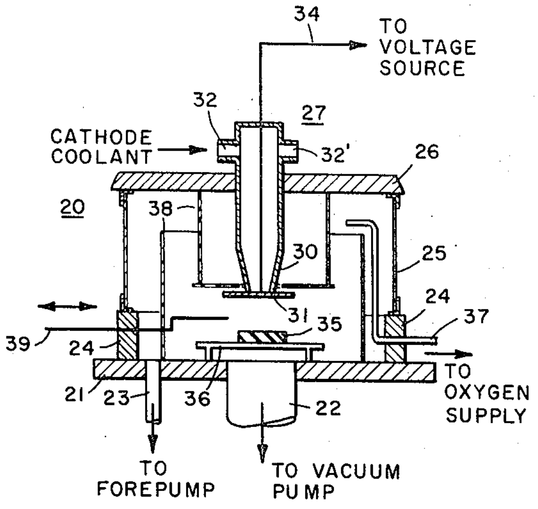
FIG. 5 is a side view in section of a reactive sputtering apparatus suitable for use in the present invention.

Accordingly, the thin semiconducting and insulating films are preferably formed in a sputtering chamber as shown in FIG. 5 by the reactive sputtering of a nickel cathode in a pure oxygen atmosphere wherein no inert gases, such as argon, are introduced. The sputtering chamber 20 includes base plate 21 having vacuum pump and fore pump exhaust outlets 22 and 23. The base plate 21 is provided with an upwardly extending peripheral flange 24 which is fastened in a vacuum tight manner to side wall 25. A top plate 26 having a centrally located opening therein for receiving the cathode assembly 27 is vacuum fastened to the side wall. The cathode assembly includes a hollow cathode support 30 having the metal cathode 31 mounted at the end thereof. The cathode support is provided with ports 32, 32' for the passage of a coolant therethrough and contains electrical lead 34 which is coupled to a suitable voltage source (not shown).

The substrate 35 is supported on cooled platform 36 and positioned directly below the cathode 31. Platform 36 is coupled to ground to complete the electrical circuit for the sputtering current. In addition, the oxygen required for the formation of the metal oxide film on substrate 35 is provided through input port 37 in flange 24. The shield elements 38 are provided within chamber 20 to shield the walls of the chamber from the sputtered cathode material. Also, shutter 39 having an external control arm is provided to interrupt the flow of sputtered material at any desired time.

In operation, the system is pumped down to $10^{-7}$ or $10^{-8}$ torr. When pumped down to the desired pressure, oxygen is supplied to the chamber so that the pressure is within the range of 10 to 80 millitorr. Then, the cathode sputtering voltage is applied via lead 34 to the system. This voltage may be an r.f. sputtering voltage at frequencies of the order of several megahertz or may be a d.c. voltage. The voltage is typically within the range of 0.7 to 3.5 KV. When the chamber is supplied with oxygen, it is desirable to maintain the pressure substantially constant with a variation of about ±1%. This pressure stability increases the uniformity of the sputtered films since the properties of these films are found to be dependent upon the deposition rate which is controlled in part by the gas pressure.

The resistivity of the films formed by the present method is a function of the sputtering rate. In the following discussion, this rate is determined by the rate at which the thickness of the deposited film changes. The sputtering rate in a particular sputtering chamber is determined by a number of factors. The principal factors are the cathode voltage, the spacing between cathode and substrate, the area of the cathode, the temperature to which the cathode is heated during sputtering and the pressure of the oxygen in the system. To obtain the defect-nickel oxide semiconducting films hereinbefore discussed, the sputtering rate is required to be within the range of 10 to 100 Angstroms per minute for oxygen pressures within the range of 10 to 80 millitorr.

Figure 6:
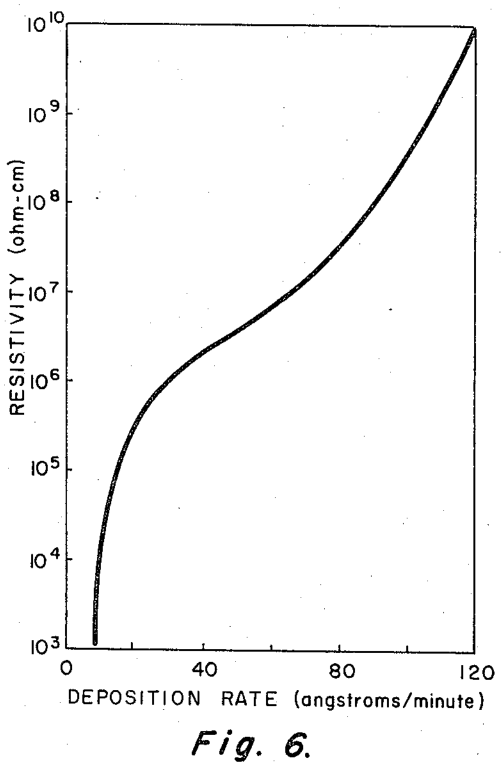
FIG. 6 shows the variation in electrical resistivity with deposition rate for films formed in accordance with the present invention.

In operation, the application of a voltage to the cathode results in a heating of the cathode and the partial oxidation of the cathode material. The cathode material is sputtered and reacts with the oxygen in the environment. The low sputtering rate occurs when the cathode current density is relatively low and the cathode is heated to a relatively low temperature of 200° to 300°C. As a result, the surface of the substrate is partially oxidized and a nickel-nickel oxide mixture is sputtered. By insuring that the oxygen pressure is at least 10 millitorr, the nickel in the sputtered mixture becomes oxidized as it travels to the substrate. At sputtering rates of less than 100 Angstroms per minute, sufficient oxygen atoms are trapped in the film as it is formed to generate the defect-nickel oxide semi-conducting film. At deposition rates in excess of 100 Angstroms per minute, the film thickness increases rapidly and the defect-nickel oxide is not formed. The absence of the defect-nickel oxide at the high sputtering rates indicates that no appreciable number of oxygen atoms are trapped. The curve of FIG. 6 shows the variation of resistivity with sputtering rate for a sputtering chamber having an oxygen pressure of 50 millitorr.

Figure 7:
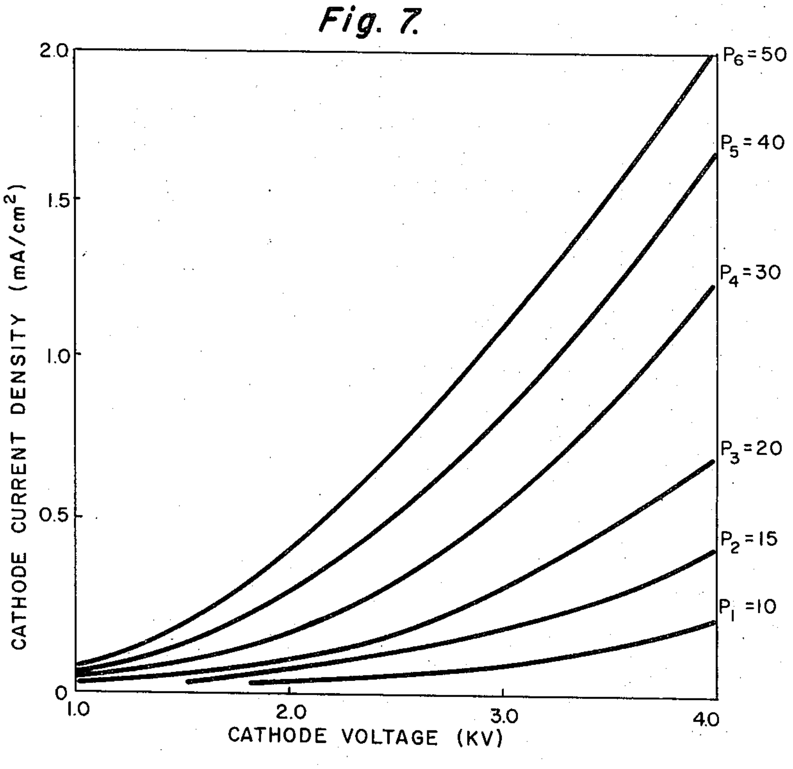
FIG. 7 shows the effect of oxygen pressure on the cathode current density in the formation of these films.

As mentioned, the sputtering rate is determined principally by the cathode voltage, cathode current density and oxygen pressure. The effects of the variation in oxygen pressure P from 10 to 50 millitorr is shown by the curves of FIG. 7. It is shown in FIG. 7 that increasing the oxygen pressure increases the current density for a particular cathode voltage and, thus, increases the sputtering rate. In practice, the maximum oxygen pressure that can be utilized to provide the defect metal oxide film is approximately 100 millitorr. At higher pressures, the film formed has a resistivity in excess of $10^8$ ohm/cm.

When the semiconducting film is formed to the desired thickness, the sputtering rate is increased to a rate in excess of 120 Angstroms per minute for the formation of the insulating film. At this time, shield 39 may be placed between the cathode and the substrate until the deposition rate stabilizes at the desired rate for the deposition of the insulation material. This point in time can be determined by externally monitoring the cathode current. The sputtering rate is increased by increasing the cathode voltage. This results in an increase in the temperature of the cathode, which can be externally controlled if desired, and a corresponding increase in the thermal oxidation of the cathode material. Thus, the material sputtered from the cathode is more completely oxidized than in the formation of the semiconducting film. However, this material is deposited at a rate which prevents the trapping of a significant amount of oxygen atoms in the deposited film. When the desired film thickness is obtained, the sputtering voltage is removed and further processing can be performed in the chamber.

As a result of this process, the semiconducting and insulating films for a thin film transistor can be formed in a continuous manner by controlling the current density to vary the deposition rate during the reactive sputtering. Also, this method enables the complete device to be formed in a single chamber since the evaporation of the metal source and drain electrodes occurs prior to the formation of the semiconducting and insulating films and the control gate electrode evaporation occurs subsequent thereto. After the initial evaporation, the sputtering chamber is pumped down and then filled with oxygen to the appropriate pressure. Upon completion of the formation of the films, the oxygen is pumped out prior to the evaporation of the metal for the gate electrode. Although the method has referred to formation of undoped nickel oxide films, the method can also be employed with doped cathode materials to form layer structures of varying resistivity.

While the above description has referred to specific embodiments of the invention, it will be recognized that many variations and modifications may be made therein without departing from the spirit and scope of the invention.

What is claimed is:

1. A solid state device comprising:

a. an insulative substrate;

b. first and second spaced metal electrodes formed on said substrate;

c. a film of amorphous defect-nickel oxide having a resistivity not greater than $10^8$ ohm-centimeters formed on said substrate, at least a portion of said film being formed in the separation between said first and second electrodes;

d. a film of insulating material of nickel oxide formed on the defect-nickel oxide film, at least a portion of the insulating film overlying a portion of the separation between said first and second electrodes, and e. a gate electrode formed on the insulating film and overlying a portion of the separation between said first and second electrodes.

2. A solid state device in accordance with claim 1 wherein said film of defect-nickel oxide has the general formula $Ni_{(1-x)}O$ wherein $x$ is within the range of $10^{-7}$ to $10^{-2}$.

3. A solid state device in accordance with claim 1 wherein the nickel oxide insulating film has a resistivity not less than $10^{10}$ ohm-centimeters.

* * * * *

UNITED STATES PATENT OFFICE
CERTIFICATE OF CORRECTION

Patent No. 3,872,359 Dated March 18, 1975

Inventor(s) Alfred E. Feuersanger

It is certified that error appears in the above-identified patent and that said Letters Patent are hereby corrected as shown below:

Page 1, after the name of the inventor, insert the following:

--Assignee: GTE LABORATORIES INCORPORATED
Waltham, Massachusetts--

Signed and Sealed this

*ninth* Day of *March 1976*

[SEAL]

*Attest:*

RUTH C. MASON
*Attesting Officer*

C. MARSHALL DANN
*Commissioner of Patents and Trademarks*